(12) United States Patent
Blaine

(10) Patent No.: US 9,871,362 B2
(45) Date of Patent: Jan. 16, 2018

(54) ELECTRICAL JUNCTION BOX

(71) Applicant: Ryan M. Blaine, Wichita, KS (US)

(72) Inventor: Ryan M. Blaine, Wichita, KS (US)

(*) Notice: Subject to any disclaimer, the term of this patent is extended or adjusted under 35 U.S.C. 154(b) by 0 days.

(21) Appl. No.: 15/161,096

(22) Filed: May 20, 2016

(65) Prior Publication Data
US 2016/0344175 A1 Nov. 24, 2016

Related U.S. Application Data

(60) Provisional application No. 62/179,923, filed on May 22, 2015.

(51) Int. Cl.
*H02G 3/08* (2006.01)
*H02G 15/115* (2006.01)
*H05K 5/02* (2006.01)

(52) U.S. Cl.
CPC ............ *H02G 15/115* (2013.01); *H02G 3/08* (2013.01); *H02G 3/083* (2013.01); *H05K 5/0247* (2013.01)

(58) Field of Classification Search
USPC .................................................... 174/50, 66
See application file for complete search history.

(56) References Cited

U.S. PATENT DOCUMENTS

| | | | |
|---|---|---|---|
| 1,056,584 A | 3/1913 | Rosenkranz | |
| 2,378,861 A | 6/1945 | Peevey | |
| 3,584,136 A | 6/1971 | Robert | |
| 3,896,960 A | 7/1975 | Schindler et al. | |
| 4,202,457 A | 5/1980 | Tansi | |
| 4,246,436 A | 1/1981 | Hoffman et al. | |
| 4,791,244 A | 12/1988 | Taybl | |
| 5,316,165 A | 5/1994 | Moran, Jr. | |
| 5,568,362 A * | 10/1996 | Hansson | H02B 1/305 174/50 |
| 5,663,525 A | 9/1997 | Newman | |
| 5,904,260 A | 5/1999 | Bauer et al. | |
| 6,147,306 A | 11/2000 | Wilkins | |
| 6,170,685 B1 | 1/2001 | Currier | |
| 6,359,222 B1 | 3/2002 | Norvelle | |
| 6,929,140 B2 | 8/2005 | Rose | |
| 7,381,907 B1 | 6/2008 | Frusco | |
| 8,642,885 B2 | 2/2014 | Davila et al. | |

FOREIGN PATENT DOCUMENTS

CN 102064503 11/2010
WO WO2011/097409 8/2011

* cited by examiner

*Primary Examiner* — Dhirubhai R Patel
(74) *Attorney, Agent, or Firm* — Kenneth H. Jack; Davis & Jack, L.L.C.

(57) ABSTRACT

An electrical junction box including an upper case half having at least a first upper cable passage port, the upper case half opening forwardly and being rearwardly chamfered; a lower case half having at least a first lower cable passage port, the lower case half opening forwardly and being rearwardly chamfered; and a pair of hingedly attached pivot arms connected operatively to the upper and lower case halves, the pivot arms being adapted for facilitating movements of the upper case half between recessed and wire receiving positions, the upper case half overlying the lower case half upon movement to the recessed position, and the upper case half displacing forwardly from the recessed position upon movement toward the wire receiving position.

11 Claims, 8 Drawing Sheets

ELECTRICAL JUNCTION BOX

CLAIM OF PRIORITY FROM PREVIOUSLY FILED PROVISIONAL PATENT APPLICATION

This non-provisional patent application claims the benefit of and priority from U.S. provisional patent application No. 62/179,923 filed May 22, 2015. The inventor disclosed in and applicant of said provisional application is the same person as the person who is disclosed as the inventor and applicant of the instant application. The applicant asserts that structures and functions of structures disclosed and described in the instant application are substantially identical to those disclosed in said provisional application.

FIELD OF THE INVENTION

This invention relates to electrical components and hardware. More particularly, this invention relates to wall mounted electric junction boxes such as electric circuit breaker boxes.

BACKGROUND OF THE INVENTION

Electrical cables which serve a house's or a building's electrical components, such as light fixtures, wall switches, and electric wall sockets, commonly extended through the building's interior wall spaces, ceiling, and attic spaces. Such cables commonly converge at a centralized junction within the building and a circuit breaker box is commonly installed at such junction point.

Within the building, such centralized junction of electrical cables is commonly forwardly bounded by interior wall paneling such as sheetrock and is laterally bounded by vertical wall studs. The cable junction is also typically rearwardly bounded by the building's exterior wall sheathing, by opposing interior wall paneling, or by a basement wall. Access to such centralized junction point commonly comprises a rectangular aperture cut through the sheetrock paneling. Such circuit breaker box apertures are preferably closely fitted for nesting receipt and installation of a conventional rectangular wall mounted electric circuit breaker box.

The desirable close fitting of the dimensions of such sheetrock aperture to the peripheral dimensions of such conventional circuit breaker box may complicate the installation of the circuit breaker box. An installer of such conventional circuit breaker box may initially deflect the electric cables upwardly and downwardly to cause their ends to reside above and below the circuit breaker box aperture. Thereafter, the installer may directly nestingly install the circuit breaker box within the rectangular space which is temporarily cleared of cables. However, following such nesting installation, the cabling is difficult to grasp and pull downwardly and upwardly through the box's upper and lower cable ports. The breaker box installer may alternatively initially extend the cables forwardly through the sheetrock aperture. However, such forwardly protruding cables undesirably mechanically interfere with the box's nesting installation.

A commonly performed and relatively undesirable solution to the above described box installation difficulties includes initially cutting an oversized sheetrock aperture to provide cable manipulating clearance zones above and/or below the circuit breaker box. However, such aperture enlarging "work around" undesirably requires sheetrock patching steps to be subsequently performed.

The instant inventive electrical junction box solves or ameliorates problems and deficiencies of conventional junction boxes and circuit breaker boxes, as described above, by configuring the junction box to include specially chamfered vertical and oppositely vertical half sections.

BRIEF SUMMARY OF THE INVENTION

The instant inventive electrical junction box is preferably utilized as an electric circuit breaker box for housing circuit breakers, circuit breaker mounts, neutral bar buses, and electric cables extending to and from such components. Notwithstanding, other types of electrical components, appliances, and switches may be housed within the instant inventive electric junction box and are considered to fall within the scope of the invention.

A first structural component of the instant inventive electrical junction box comprises a vertical case half which is opened by at least a first, and preferably by a plurality of vertical cable passage ports. In a preferred embodiment, the vertical case half further opens forwardly to form a portion of a forward door opening. Also, in the preferred embodiment, the vertical case half is rearwardly chamfered. Suitably, the vertical case half may be positioned upwardly with respect to other structures described below. Notwithstanding, other positions of the vertical case half are considered to fall within the scope of the invention.

A further structural component of the instant inventive electric junction box comprises an oppositely vertical case half which is, similarly with the vertical case half, opened by at least a first oppositely vertical cable passage port. The oppositely vertical case half preferably further opens forwardly to form the remainder of the case's forward door opening. Also in the preferred embodiment, the oppositely vertical case half is forwardly chamfered.

A further structural component of the instant inventive electrical junction box comprises means for mounting the vertical case half upon the oppositely vertical case half, such means being adapted for facilitating movements of the vertical case half between a recessed position and a wire or cable receiving position. Upon movement by the vertical case half to the recessed position, the vertical case half preferably overlies and vertically aligns with the oppositely vertical case half. Alternatively, upon movement of the vertical case half toward its wire receiving position, the vertical case half displaces forwardly from the installed recessed position.

In operation of the instant inventive electrical junction box, a box installer may, for example, initially extend the oppositely vertical end of the oppositely vertical case half into a rectangular breaker box receiving aperture cut within a sheetrock wall. Substantially contemporaneously with such oppositely vertical case half extension, the installer may thread upwardly extending cables through such half's oppositely vertical cable passage ports. Alternatively, where the oppositely vertical cable passage ports reside within a preferably provided pivoting wall, such cables may initially enter the junction box via upward wall pivoting rather than cable port threading.

Thereafter, with the vertical case half displaced forwardly to its wire receiving position, the installer may easily and conveniently grasp and route downwardly extending cables to traverse the vertical end of the oppositely vertical case half's rearward wall. Thereafter, such cables may be extended downwardly into the interior space of the oppositely vertical case half. Thereafter, the installer may easily and conveniently thread such downwardly extending cables through the vertical case half's vertical cable passage ports. Contemporaneously, the installer may nestingly position the entirety of the oppositely vertical case half. Thereafter, the installer may manipulate the box's mounting means for movement of the vertical case half to its rearward recessed position. The chamfer components of the case halves advantageously allow the movement to the recessed position without any mechanical interference between the cables and the edges of the case and aperture. Upon completion of such installation steps, the electrical junction box is advantageously installed and recessed within a closely fitted sheetrock circuit breaker box aperture with no cable mechanical interference, with all needed cabling conveniently extending into the box's interior, and without any follow up sheetrock repairs.

Suitable embodiments of the inventive junction box's mounting means comprise eye, flange, and screw combinations which may alternatively fix the vertical case half at its installed recessed position and release such half for forward displacement towards the wire receiving position. The mounting means may further alternatively comprise laterally paired pivot arms, laterally paired flexible ties, laterally paired bendable ties, laterally paired slide pin and slide channel combinations, and laterally paired slotted pivot arms and slide pin combinations.

Accordingly, objects of the instant invention include the provision of an electrical junction box which incorporates structures, as described above, and which arranges those structures in relation to each other in manners described above for the achievement of the beneficial functions described above.

Other and further objects, benefits, and advantages of the instant invention will become known to those skilled in the art upon review of the Detailed Description which follows, and upon review of the appended drawings.

DETAILED DESCRIPTION OF A PREFERRED EMBODIMENT

Figure 1:
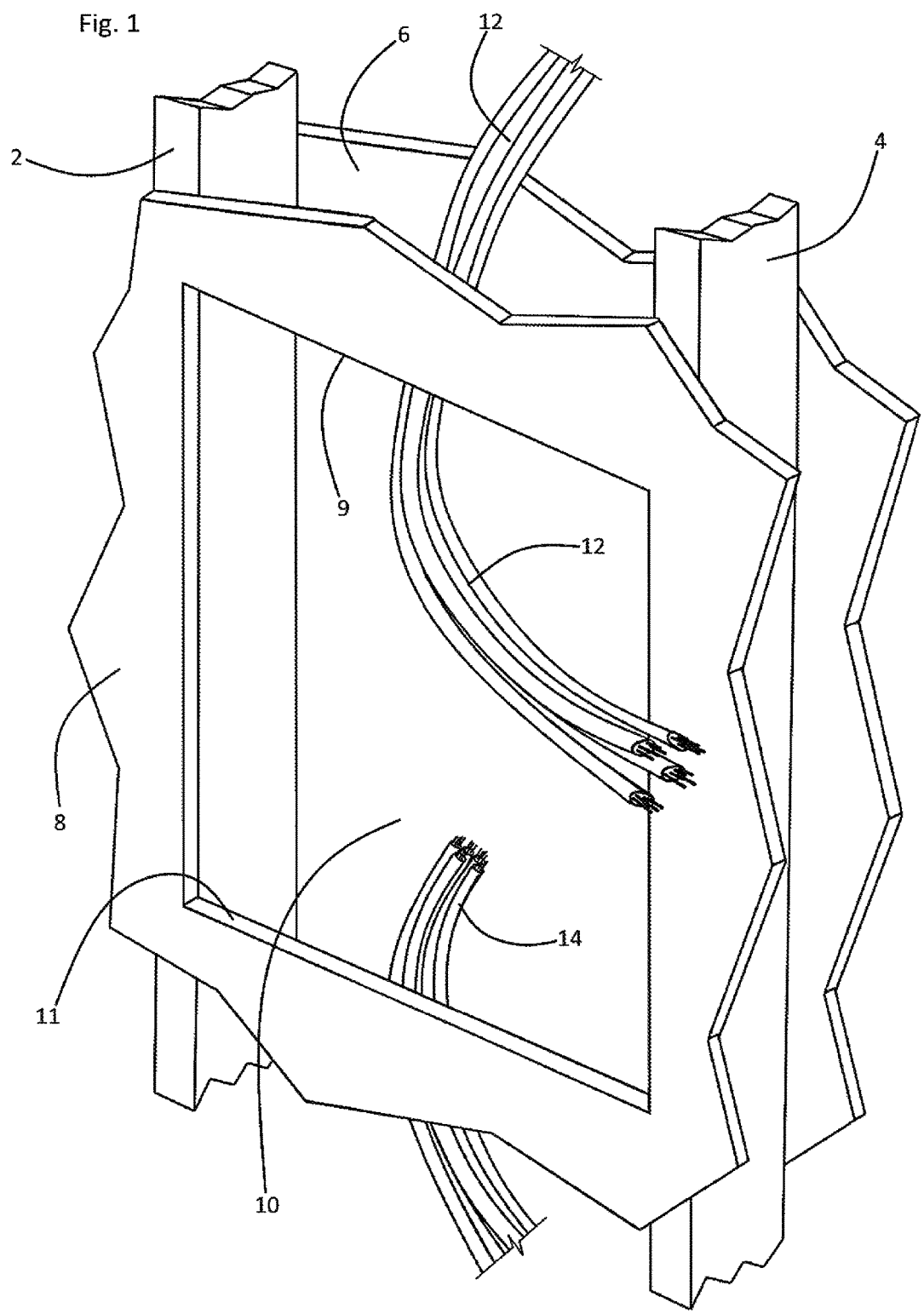
FIG. 1 is a cutaway perspective view of an exemplary interior wall section within which the inventive electrical junction box may be installed.
Figure 2:
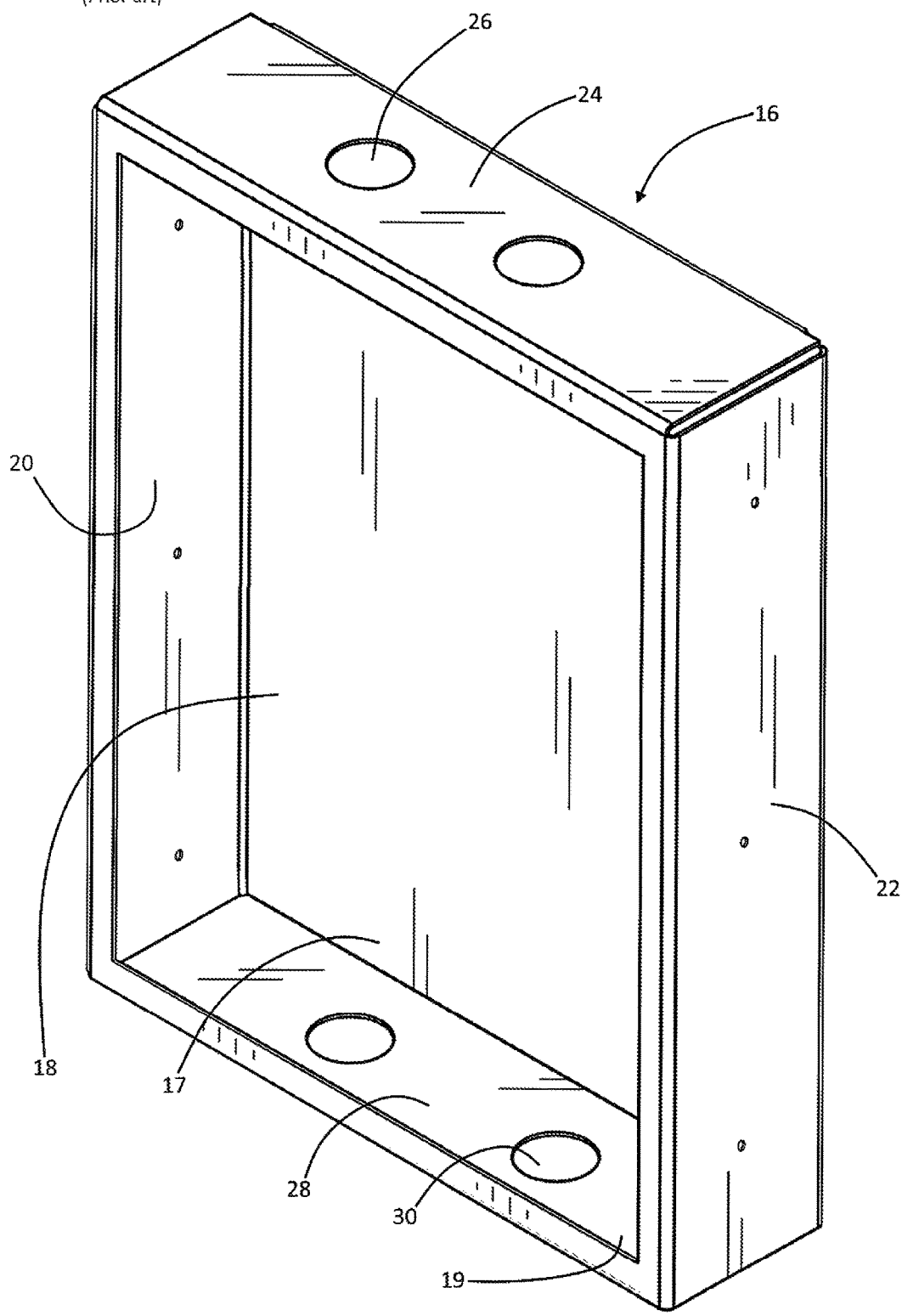
FIG. 2 is a perspective view of a prior art electrical junction box.

Referring now to the drawings and in particular to Drawing FIG. 1, a typical installation environment within which the instant inventive electrical junction box may be installed comprises a building wall which incorporates a series of vertical wall studs 2 and 4, such studs laterally defining a cable junction space 10. The space 10 is forwardly bounded by sheetrock wall paneling 8 and is rearwardly bounded by opposing interior wall sheetrock paneling 6 which may alternatively comprise the building's exterior wall sheathing or a basement wall surface. Referring further simultaneously to FIG. 2, a prior art conventional electrical junction box is referred to generally by Reference Arrow 16, such box having a rectangular back wall 17, lateral walls 20 and 22, and vertical and oppositely vertical walls 24 and 28. The interior space 18 of the conventional electrical junction box 16 is vertically opened by cable ports 26 and is oppositely vertically opened by cable ports 30, the interior space 18 further opening forwardly at a rectangular door opening 19.

Referring further simultaneously to FIGS. 1 and 2, the rectangular sheetrock aperture 11 is preferably closely fitted to the rectangular peripheral dimensions of a box such as junction box 16. Upon such close fitting, an installer of the box 16 may initially upwardly thread a lower cable bundle 14 through ports 30 while substantially simultaneously extending the oppositely vertical end of the box 16 through the lower end of aperture 11 and into space 10. Upon doing so, the installer may undesirably find that, due to mechanically interference between the upper cable bundle 12, the upper edge 9 of aperture 11, and the vertically upper end of the case 16, such lower end installation steps cannot be replicated with respect to the upper end of the junction box 16. Reversal of such installation steps with the vertically upper end of the electrical junction box 16 initially installed frustratingly results in mechanical interference at the oppositely vertical or lower end of the box 16 and aperture 11.

The above described mechanical interference may be ascribed to the typical cross-sectional dimensions of common electric supply cables and cable bundles (such as cable bundles 12 and 14) which may extend into and out of such box 16. According to electrical components industry standards, such cable or cable bundle's thickness dimension may be as little as ¾", and such minimum thickness tends to interfere with installations of conventional boxes such as box 16.

Alternatively, the installer may "stuff" the cables 12 and 14 upwardly and downwardly to clear them from exposure at aperture 11. Thereafter, the installer may easily rearwardly recess and install the electrical junction box 16 in a nesting manner within space 10. However, upon such nesting box installation, the installer is left with a difficult task of "fishing" cables 12 and 14 downwardly and upwardly through cable ports 26 and 30.

To relieve the installation conflicts and problems described above, the installer may alternatively initially cut the vertical and/or oppositely vertical ends of aperture 11 to be oversized with respect to the box 16. However, such aperture enlarging solution undesirably requires subsequent sheetrock patching and restoration.

Figure 3:
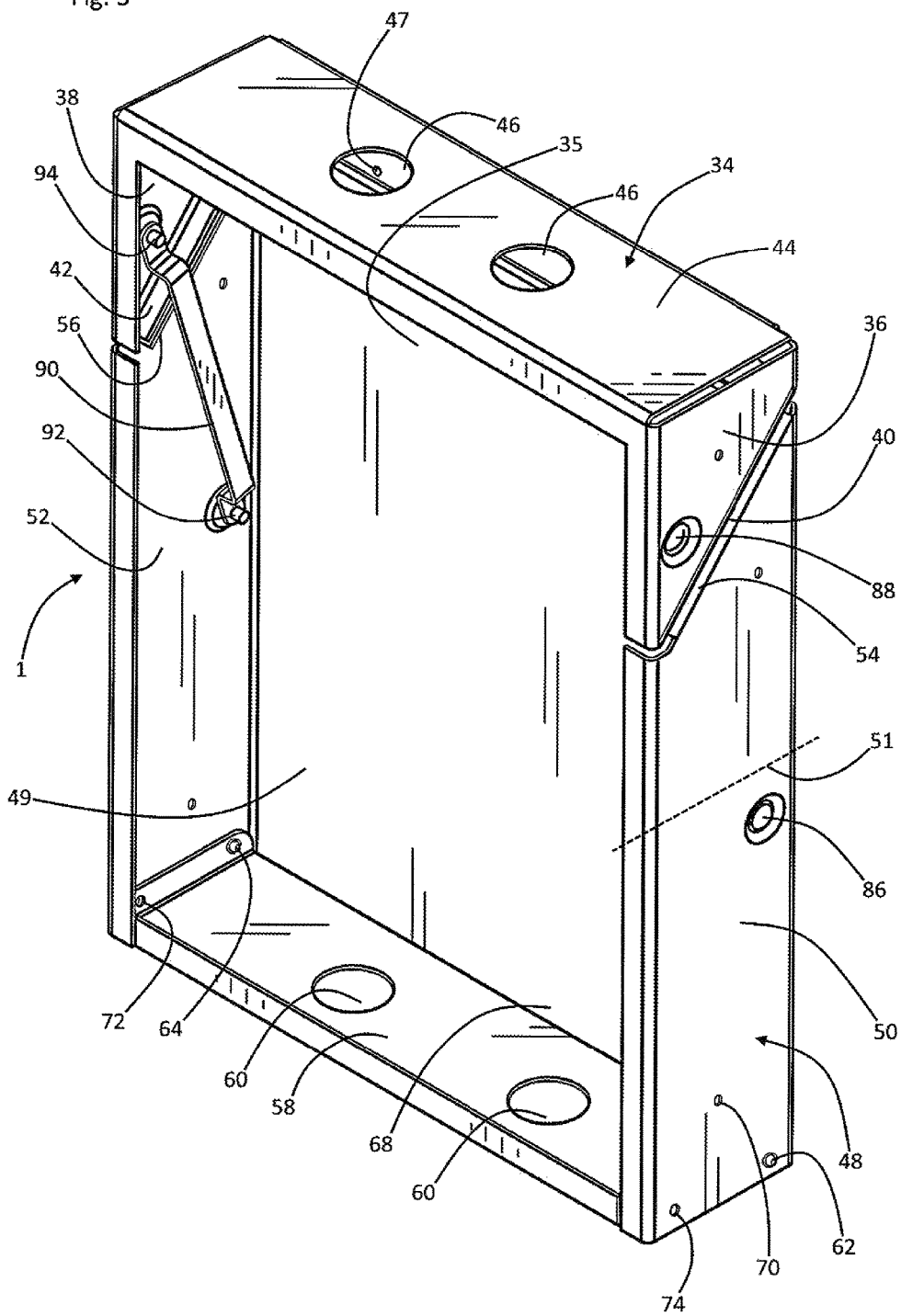
FIG. 3 is a perspective of a preferred embodiment of the instant inventive electrical junction box.

Referring to FIG. 3, the instant inventive electrical junction box, which is referred to generally by Reference Arrow 1, solves the above described conventional junction box installation problems by specially segmenting the box. The instant invention configures the junction box 1 to include a vertical case half which is referred to generally by Reference Arrow 34, and an oppositely vertical case half which is referred to generally by Reference Arrow 48. In the preferred embodiment, the vertical case half 34 has a forward opening 35 which forms a vertical portion of a forward door opening, and the oppositely vertical case half 48 correspondingly includes a forward opening 49 which forms the remainder of such forward door opening. The vertical case half 34 is preferably further opened by at least a first and preferably a plurality of vertical cable ports 46, and the oppositely vertical cable half 48 is similarly oppositely vertically opened by at least a first, and preferably a plurality of oppositely vertical cable ports 60.

The vertical case half 34 is preferably rearwardly chamfered and, correspondingly, the oppositely vertical case half 48 is forwardly chamfered. As depicted in FIG. 3, such case halves' rearward and forward chamfers preferably and respectively reside at the vertical case half's lateral walls 36 and 38, and at the oppositely vertical case half's lateral walls 50 and 52. In particular, the invention's rearward chamfer component preferably comprises angled oppositely vertical ends 40 and 42 of lateral walls 36 and 38, and the invention's forward chamfer components preferably comprise angled vertical ends 54 and 56 of lateral walls 50 and 52.

While the vertical case half 34 is positioned at its recessed and installed position, as depicted in FIG. 3, the rearwardly and forwardly chamfered lateral wall ends 40,42, and 54,56 are preferably parallel to each other, and are angled with respect to a horizontal plane coinciding with a building's horizontal floor between 35° and 65°. The invention's chamfer components 40, 42, 54, and 56 advantageously prevent mechanical interference upon movements of the vertical case half 34 to and from its recessed position while the oppositely vertical case half 48 nests within an installation recess such as, referring further to FIG. 1, space 10 behind a closely fitted aperture 11.

While the chamfered lateral wall ends 40,42 and 50,56 may suitably reside at or near the vertical mid-line 51 of the case 1, such chamfered faces or edges are preferably substantially displaced vertically or oppositely vertically from such mid-line, as depicted in FIG. 3. Such vertical or oppositely vertical displacement of the case half defining seams advantageously allows one of the case's halves to function as a main case body while the other half functions as a cover or cap. While a displacement of the chamfered edges or faces from the midline 51 is desireable, such displacement should not allow the back wall portion of the vertical case half 34 to interfere with received cables 12 or 14 upon movement of such case half to its recessed position. Accordingly, such displacement preferably positions the rearward ends of the chamfered lateral wall faces or edges 40,42 and 50,56 at least ¾" away from the extreme vertical or oppositely vertical end of the case, such ¾" displacement restriction accommodating for the minimum cross-sectional dimension of an electric supply cable or cable bundles 12 or 14.

Further structural components of the instant inventive case 1 comprise vertical and oppositely vertical walls 44 and 58, the vertical wall 44 spanning laterally between vertical ends of lateral walls 36 and 38, and the oppositely vertical wall 58, similarly spanning laterally between the oppositely vertical ends of lateral walls 50 and 52. In the preferred embodiment, the vertical and oppositely vertical cable ports 46 and 60 respectively open at such walls 44 and 58.

Figure 4:
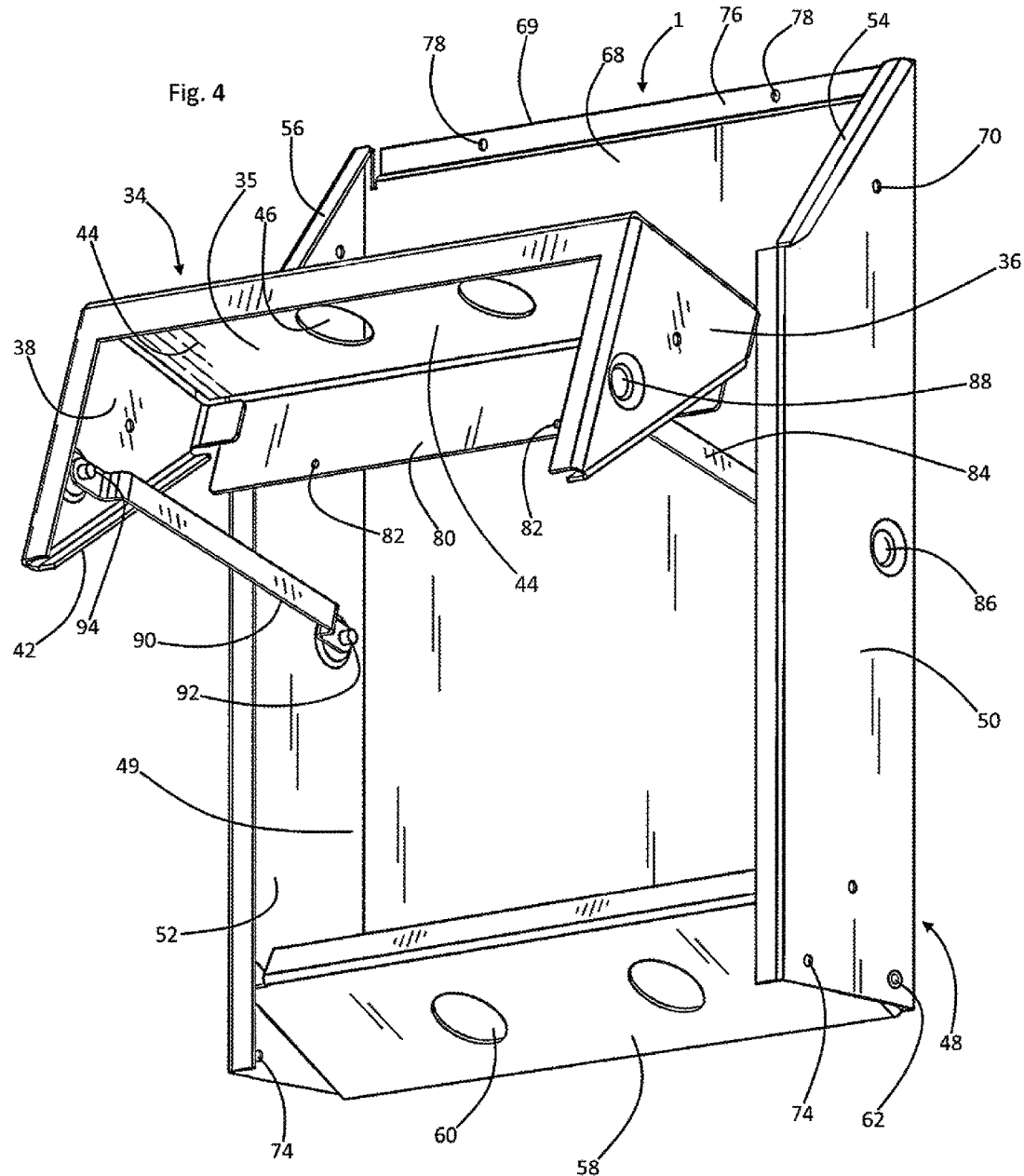
FIG. 4 is an alternate perspective view of the electrical junction box of FIG. 3, the view of FIG. 4 showing components pivotally moved.

Referring simultaneously to FIGS. 3 and 4, the case's oppositely vertical wall 58 is preferably hingedly and pivotally mounted to the lateral walls 50 and 52 by means of pivot pins 62 and 64. Such pivot pins facilitate pivotal motions of the wall 58 between a horizontally extending use configuration, as depicted in FIG. 3, and an upwardly deflected cable passage position, as depicted in FIG. 4. Alternatively, referring further to FIG. 8, the case's oppositely vertical wall may comprise a fixed wall 59. The rearward end of the case 1 is preferably closed by a rear wall 68.

Referring further simultaneously to FIGS. 3 and 4, mounting means which operatively interconnect the vertical case half 34 and the oppositely vertical case half 48 are preferably provided, such means preferably comprising laterally paired pivot arms 84 and 90. The proximal or rearward ends of pivot arms 84 and 90 are preferably respectively pivotally attached to lateral walls 50 and 52 by pivot joints 86 and 92. Correspondingly, the distal ends of the pivot arms 84 and 90 are pivotally attached to lateral walls 36 and 38 by pivot joints 88 and 94.

Referring simultaneously to FIGS. 1 and 3-5, an installer of the junction box 1 may initially upwardly pivot oppositely vertical wall 58, and may extend the rearward and oppositely vertical end of the oppositely vertical case half 48 into aperture 11, such extension positioning the oppositely vertical end of the rear wall 68 rearwardly from electrical cables 14. Thereafter, the installer may upwardly thread cables 14 through cable ports 60, and may then downwardly pivot wall 58 to the horizontal use position depicted in FIG. 5.

With the vertical case half 34 pivoted forwardly to its wire receiving position, as depicted in FIG. 4, the installer may successively draw upper cables 12 forwardly to extend over the extreme upper end 69 of the oppositely vertical case half's back wall 68. Thereafter, the installer may downwardly thread cables 12 through vertical cable ports 46. Thereafter, the installer may easily and conveniently move the vertical case half 34 rearwardly from the FIG. 4 wire receiving position to the FIG. 5 recessed position, such motion being guided by pivot arms 84 and 90. The angled chamfering of the vertical and oppositely vertical ends of the lateral walls 50,52 and 36,38 advantageously allows the vertical case half 34 to move upwardly and rearwardly into vertical alignment with the oppositely vertical case half 44 without mechanically interfering with the upper edge 9 of the breaker box aperture 11.

Figure 5:
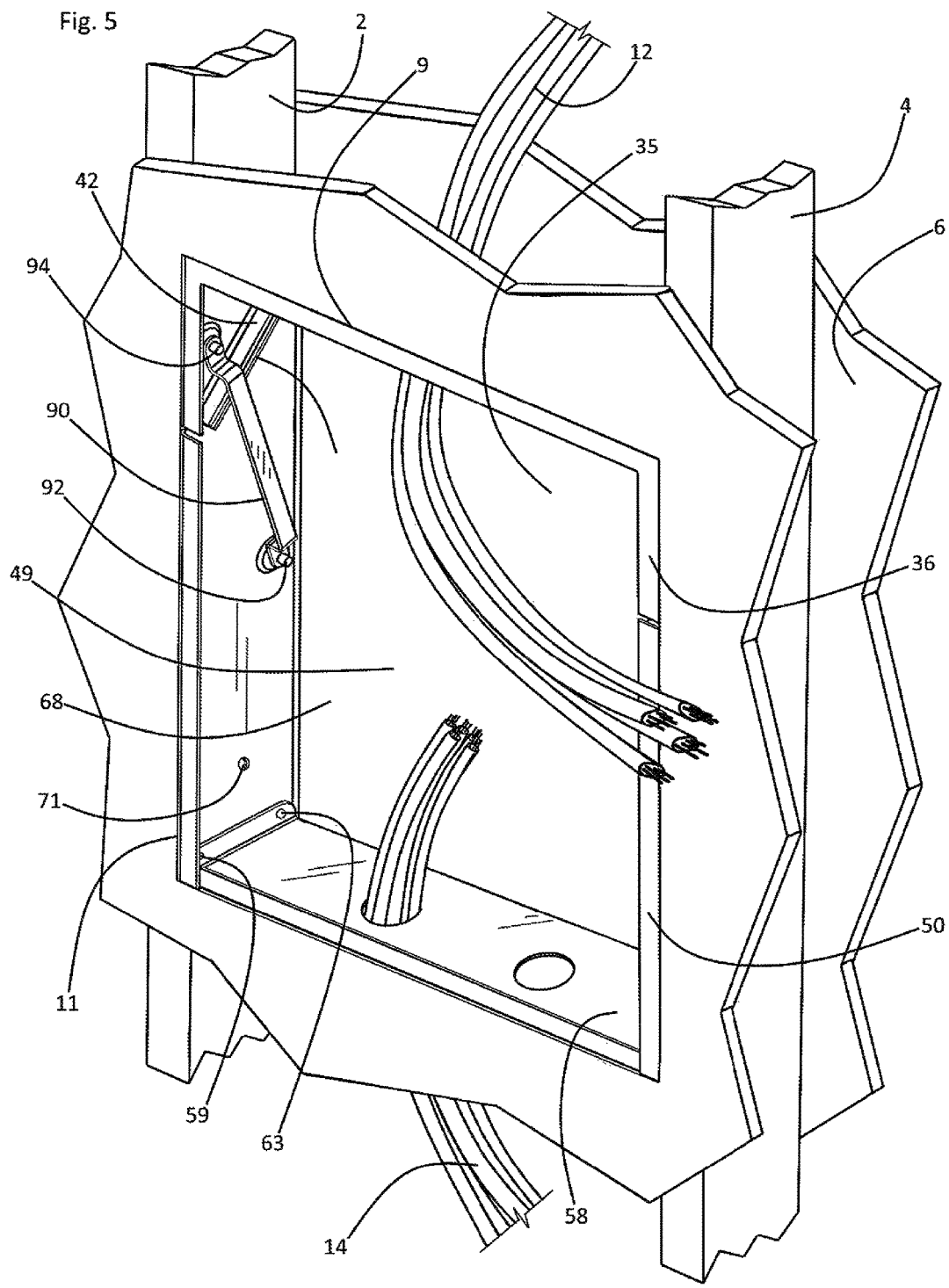
FIG. 5 depicts the electrical junction box of FIG. 3 installed within the installation site of FIG. 1.

Upon installation of the box 1 as indicated in FIG. 5, flange 80 advantageously overlaps flange 76, with screw eyes 82 forwardly aligning with screw eyes 78. Upon such flange and eye alignments, screws 47 may be installed therethrough for securing the vertical case half 34 at its recessed and installed position over the oppositely vertical case half 48. Screws 59 may be similarly driven through laterally aligned eyes 72 and 74 to simultaneously secure the pivoting wall 58 at its horizontal use position and to further secure the case 1 within recess space 10. Further screws 71 may be driven through screw eyes 70 for further securing the case 1.

Figure 6:
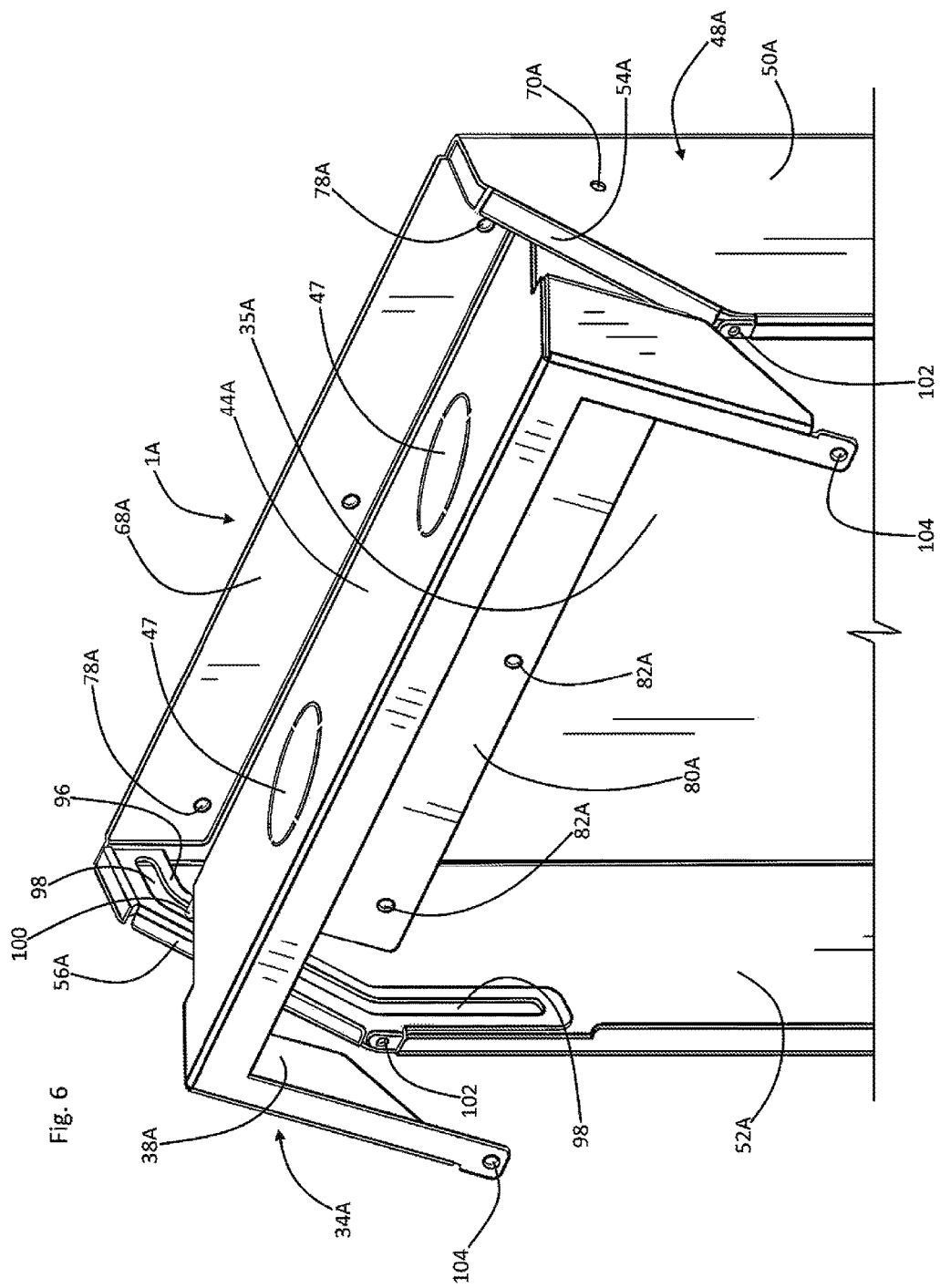
FIG. 6 presents the electrical junction box incorporating alternative vertical case half mounting means.
Figure 7:
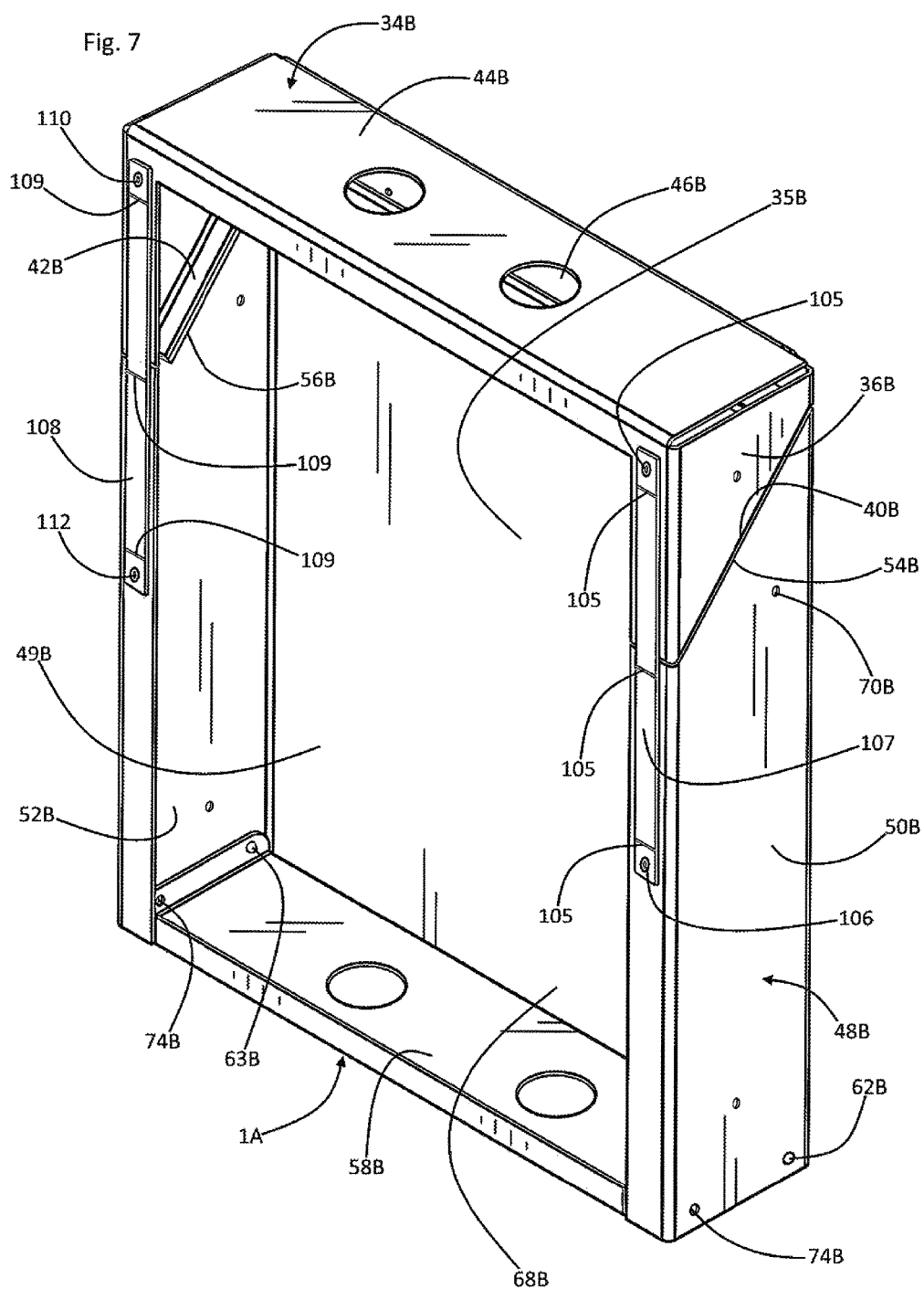
FIG. 7 presents the electrical junction box including a further alternative vertical case half mounting means.

Referring simultaneously to FIGS. 3-6, all reference numerals in FIG. 6 having the suffix "A" identify structures substantially identical to similarly numbered structures appearing in FIGS. 3-5. FIG. 6 presents an alternative vertical case half mounting means which incorporates lateral or left and right slide tracks 96 including slide slots 98 (the right slide track and slide slot mounted upon the interior face of lateral wall 50A not being within view). Lateral or left and right slide pins 100 enter and slidably engage the lateral slide slots 98 (the laterally right slide pin 100 not being within view). Sliding forward and rearward movements of the vertical case half 34A with respect to the oppositely vertical case half 48A may advantageously move the vertical case half 34A between recessed and wire receiving positions in a manner similar to the motions of vertical case half 34 described above. In the FIG. 6 alternative, vertical cable ports 47 are alternatively configured as "knock out" discs. Screw receiving alignable eyes 102 and 104 may be provided for additionally securing the vertical case half 34A at its recessed position.

Referring simultaneously to FIGS. 3-5 and 7, a further alternative mounting means is described. All structures identified in FIG. 7 by a reference numeral having the suffix "B" are substantially identical to similarly numbered structures appearing in FIGS. 3-5. In the FIG. 7 mounting means alternative, lateral flexible and/or bendable tie straps 107 and 108 are provided, such straps vertically spanning between and interconnecting the vertical case half 34B and the oppositely vertical case half 48B. The ties 102 and 108 may comprise plastic, woven synthetic fiber, or a metal, and the vertical and oppositely vertical ends of such ties are preferably secured by means of rivets, screws, or spot welds 104, 106, 110, and 112. Where the tie straps 107 and 108 comprise relatively rigid metal or plastic material, bend assisting scores 105 and 109 may be advantageously provided.

Figure 8:
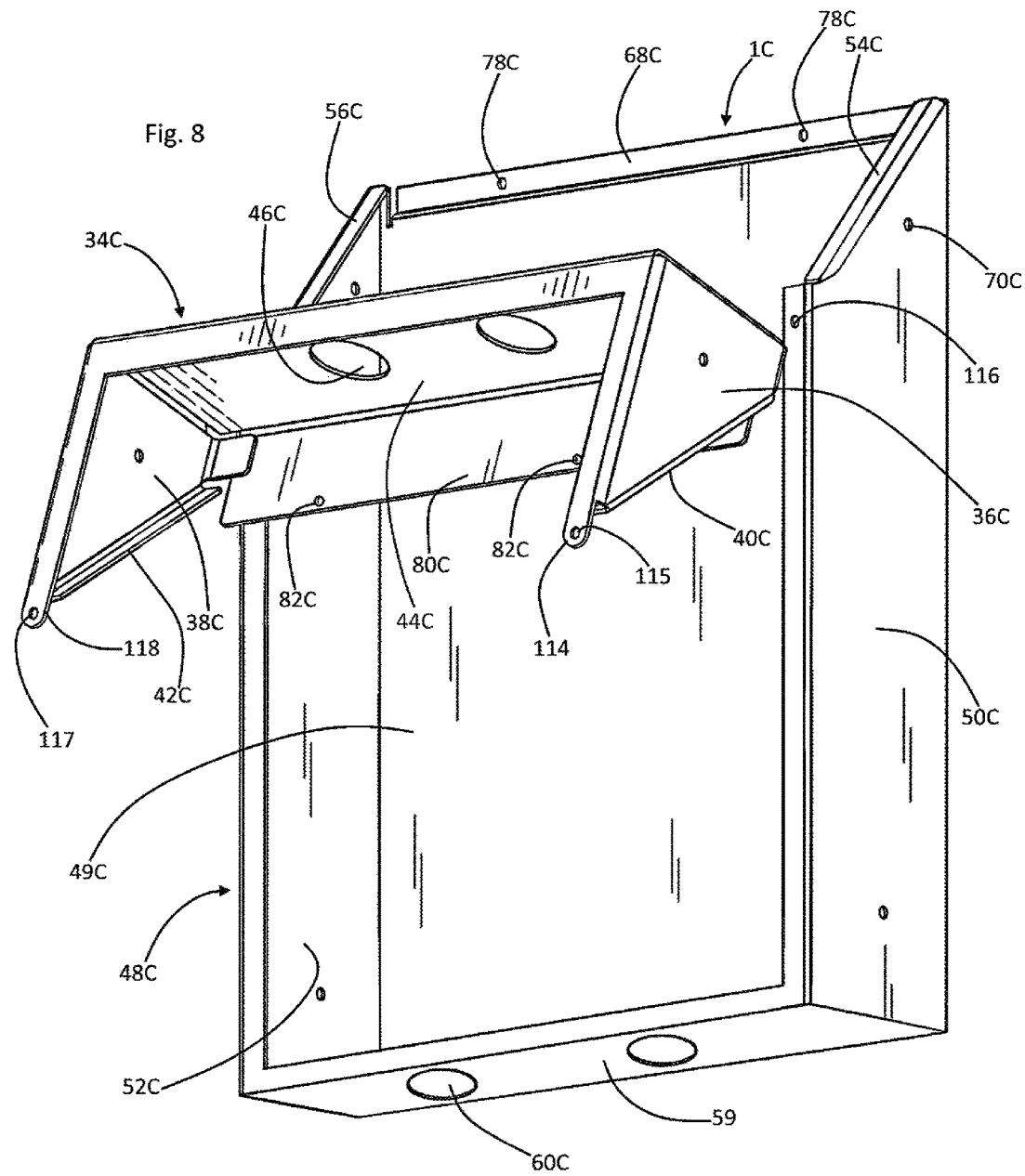
FIG. 8 presents the electrical junction box incorporating a further alternative vertical case half mounting means.

FIG. 8 presents a further suitable alternative embodiment of the invention's means for movably or removably mounting the vertical case half 34C over the oppositely vertical case half 48C. All reference numerals in FIG. 8 having the suffix "C" identify structures substantially identical to similarly numbered structures in FIGS. 3-5. FIG. 8's alternative mounting means comprise flanges 80C, 78C, 114, and 118, which incorporate alignable eyes 115, 116, 117, and 78C, such alignable eyes receiving screw fastener mounting means such as, referring to FIG. 3, screw 47.

While the principles of the invention have been made clear in the above illustrative embodiment, those skilled in the art may make modifications to the structure, arrangement, portions and components to the invention without departing from those principles. Accordingly, it is intended that the description and drawings be interpreted as illustrative and not in the limiting sense, and that the invention be given a scope at least commensurate with the appended claims.

The invention hereby claimed is:

1. An electrical junction box comprising:
    (a) a vertical case half having a vertical wall, said wall being apertured by at least a first vertical cable passage port, said case half further opening forwardly and being rearwardly chamfered;
    (b) an oppositely vertical case half having an oppositely vertical wall, said wall being apertured by at least a first oppositely vertical cable passage port, said case half further opening forwardly and being forwardly chamfered; and
    (c) means for mounting the vertical case half onto the oppositely vertical case half, said means being connected operatively to both the vertical and the oppositely vertical case halves, said means being adapted for facilitating movements of the vertical case half between recessed and wire receiving positions, the vertical case half vertically overlying the oppositely vertical case half upon movement to the recessed position and displacing forwardly from the recessed position upon movement toward the wire receiving position.

2. The electrical junction box of claim 1 wherein each case half among the vertical and oppositely vertical case halves has a pair of lateral walls, wherein each of said walls has vertical and oppositely vertical ends, wherein the vertical case half's rearward chamfer is positioned at the oppositely vertical ends of said case half's lateral walls, and wherein the oppositely vertical case half's forward chamfer is positioned at the vertical ends of said case half's lateral walls.

3. The electrical junction box of claim 2 wherein, upon the movement of the vertical case half to the recessed position, the rearward and forward chamfers are substantially parallel to each other.

4. The electrical junction box of claim 3 wherein, upon the movement of the vertical case half to the recessed position, the rearward and forward chamfers deflect between 35° and 65° from a horizontal plane.

5. The electrical junction box of claim 4 further comprising a fixed wall and a pivoting wall, the at least first vertical and oppositely vertical cable passage ports being respectively positioned at the fixed and pivoting walls.

6. The electrical junction box of claim 5 wherein the fixed wall spans between the vertical ends of the vertical case half's paired lateral walls.

7. The electrical junction box of claim 6 wherein the pivoting wall spans between the oppositely vertical ends of the oppositely vertical case half's paired lateral walls, and further comprising a pair of lateral hinges operatively interconnecting the pivoting wall and said paired lateral walls.

8. The electrical junction box of claim 2 wherein the means comprise a connector selected from the group consisting of eyed flange and screw combinations, pivot arms, slotted pivot arm and slide pin combinations, flexible ties, bendable ties, and slide pin and slide channel combinations.

9. The electrical junction box of claim 8 wherein the selected connector comprises a pair of lateral pivot arms having proximal and distal ends, said arms' proximal ends being connected at the oppositely vertical case half's lateral walls, and said arms' distal ends being connected at the vertical case half's lateral walls.

10. The electrical junction box of claim 8 wherein the selected connector comprises a pair of lateral slide pin and slide channel combinations, said combinations' slide channels being positioned at the vertical ends of the oppositely vertical case half's lateral walls, and said combinations' slide pins being fixedly attached to the vertical case half's lateral walls.

11. The electrical junction box of claim 8 wherein the selected connector comprises a pair of lateral flexible or bendable ties fixedly attached to and spanning vertically between the vertical and oppositely vertical case halves.

* * * * *